United States Patent
Stevens

(10) Patent No.: US 11,250,867 B1
(45) Date of Patent: Feb. 15, 2022

(54) INCORPORATING DATA INTO A VOICE SIGNAL WITH ZERO OVERHEAD

(71) Applicant: Rockwell Collins, Inc., Cedar Rapids, IA (US)

(72) Inventor: James A. Stevens, Lucas, TX (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 239 days.

(21) Appl. No.: 16/596,589

(22) Filed: Oct. 8, 2019

(51) Int. Cl.
*G10L 19/00* (2013.01)
*G10L 19/16* (2013.01)
*H03M 7/30* (2006.01)
*H04L 29/06* (2006.01)

(52) U.S. Cl.
CPC ......... *G10L 19/167* (2013.01); *H03M 7/6011* (2013.01); *H03M 7/6052* (2013.01); *H04L 65/607* (2013.01)

(58) Field of Classification Search
CPC . G10L 19/167; H03M 7/6011; H03M 7/6052; H04L 61/103; H04L 65/607
USPC ....... 370/401, 468, 503, 310, 352, 356, 389, 370/395.1; 375/240.01, 240.12, 240.26, 375/247; 381/80; 386/263; 704/222, 704/228, 229, 500, 501, 221; 725/87; 380/274; 705/14.64; 712/222
See application file for complete search history.

(56) References Cited

U.S. PATENT DOCUMENTS

| | | | | |
|---|---|---|---|---|
| 5,414,796 A * | 5/1995 | Jacobs | ................... | H04J 3/1688 704/221 |
| 5,473,443 A * | 12/1995 | Wilkinson | ........... | G11C 7/1075 386/241 |
| 5,706,308 A * | 1/1998 | Ichimura | .............. | H03G 3/3089 341/143 |
| 5,706,396 A * | 1/1998 | Schroder | ................ | H04B 1/667 704/228 |
| 5,751,718 A * | 5/1998 | Yip | .......................... | H04J 3/07 370/468 |
| 5,768,281 A * | 6/1998 | Takano | ................... | H04B 1/665 348/384.1 |
| 6,292,886 B1 * | 9/2001 | Makineni | ............. | G06F 9/30014 708/501 |
| 6,321,327 B1 * | 11/2001 | Makineni | ............. | G06F 9/30105 712/22 |
| 6,807,528 B1 * | 10/2004 | Truman | ................. | G10L 19/002 370/528 |
| 6,944,160 B1 * | 9/2005 | Weiss | ..................... | H04L 65/607 370/395.1 |
| 7,260,722 B2 | 8/2007 | Forstrom et al. | | |
| 7,519,823 B1 | 4/2009 | Schumacher et al. | | |
| 7,617,109 B2 * | 11/2009 | Smithers | ................ | H03G 9/005 704/500 |
| 8,055,903 B2 | 11/2011 | Adhikari et al. | | |

(Continued)

*Primary Examiner* — Gerald Gauthier
(74) *Attorney, Agent, or Firm* — Suiter Swantz pc llo

(57) ABSTRACT

A vocoder system incorporates situational awareness data into unused bits in the trailing bytes of the vocoder frames by dividing the situational awareness data according to the number of known blank bits in each vocoder frame and incorporating the data, in order, such that the receiving system can extract and reconstruct the situational awareness data. Synchronization signals of predefined bit streams are incorporated to allow the receiving system to more accurately identify situational awareness bits in the trailing byte.

13 Claims, 5 Drawing Sheets

(56) References Cited

U.S. PATENT DOCUMENTS

| | | | |
|---|---|---|---|
| 8,700,411 B2* | 4/2014 | Price | H04H 60/58 704/501 |
| 2005/0129109 A1* | 6/2005 | Kim | G10H 1/0058 375/240.01 |
| 2006/0034299 A1* | 2/2006 | Barzegar | H04M 7/0069 370/401 |
| 2006/0133372 A1* | 6/2006 | Cheong | H04L 65/607 370/389 |
| 2007/0121594 A1* | 5/2007 | Lee | H04L 29/06027 370/356 |
| 2007/0121939 A1 | 5/2007 | Olesen et al. | |
| 2007/0171902 A1* | 7/2007 | Simonsson | H04W 28/065 370/389 |
| 2008/0037658 A1* | 2/2008 | Price | G10L 19/018 375/240.26 |
| 2008/0112565 A1* | 5/2008 | Nam | G10L 19/167 380/274 |
| 2008/0298285 A1* | 12/2008 | Ramesh | H04L 65/607 370/310 |
| 2009/0063159 A1* | 3/2009 | Crockett | G10L 19/167 704/500 |
| 2010/0211981 A1* | 8/2010 | Shaul | H04N 21/41407 725/87 |
| 2010/0280832 A1* | 11/2010 | Ojala | G10L 19/24 704/500 |
| 2014/0321663 A1* | 10/2014 | Chi | G10L 19/008 381/80 |
| 2014/0362850 A1* | 12/2014 | Wakely | H04L 65/608 370/352 |
| 2016/0012487 A1* | 1/2016 | Bastaldo-Tsampalis | G06Q 30/0267 705/14.64 |
| 2016/0191931 A1* | 6/2016 | Hannuksela | H04N 19/46 375/240.12 |
| 2018/0091473 A1* | 3/2018 | Wijnands | H04L 61/103 |

* cited by examiner

INCORPORATING DATA INTO A VOICE SIGNAL WITH ZERO OVERHEAD

BACKGROUND

Existing wireless communication systems that support voice, such as military combat net radios, generally support voice and data as separate services or only support voice. Prior approaches to sending short messages, like situational awareness data, with voice transmissions either added the data at the start or end of the voice transmission. Adding the data to the start of the transmission adds delay between when the user can hit Push-to-talk (PTT) and start talking. Adding the data to the start or end of the transmission reduces system capacity by requiring additional time on the channel.

SUMMARY

In one aspect, embodiments of the inventive concepts disclosed herein are directed to a vocoder system that incorporates situational awareness data into the unused bits in the trailing bytes of the vocoder frames. The situational awareness data is divided according to the number of known blank bits in each vocoder frame and incorporated in order such that the receiving system can extract and reconstruct the situational awareness data.

In a further aspect, synchronization signals of predefined bit streams are incorporated to allow the receiving system to more accurately identify situational awareness bits in the trailing byte.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
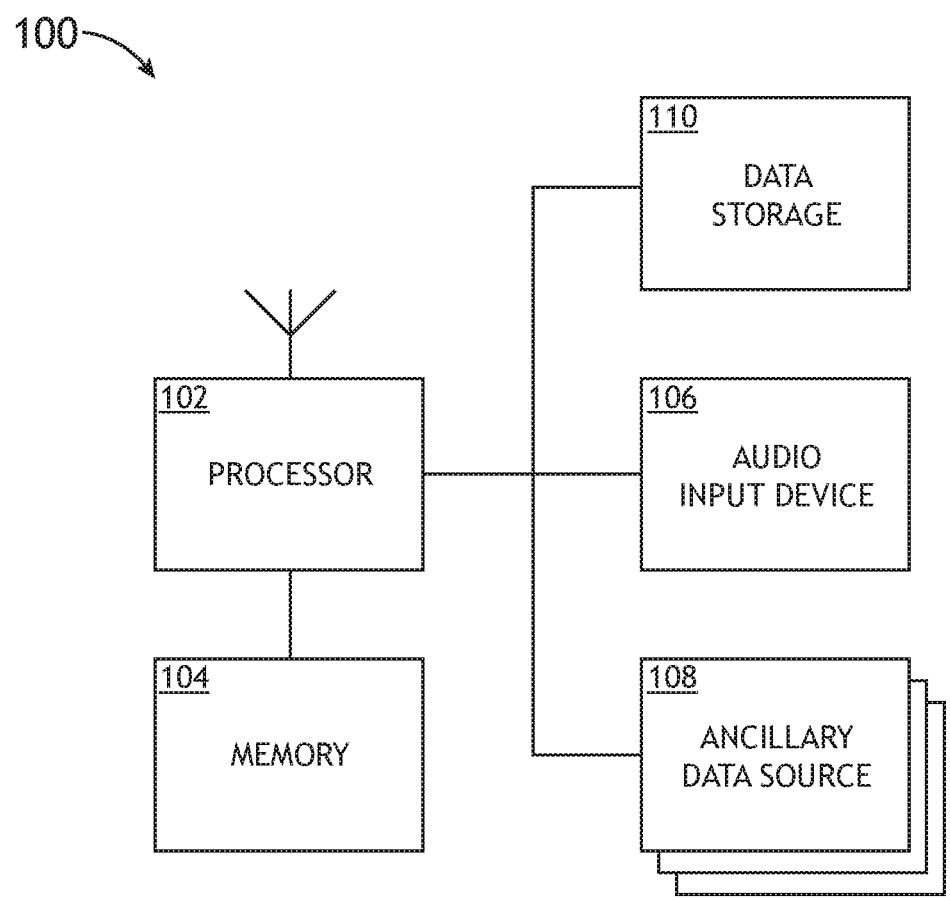
FIG. 1 shows a block diagram of a system for implementing exemplary embodiments.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for including ancillary data into an encoded voice data stream without any additional bandwidth usage.

Referring to FIG. 1, a block diagram of a system 100 for implementing exemplary embodiments is shown. The system 100 includes a processor 102, a memory 104 connected to the processor 102 for embodying processor executable code, and an audio input element 106 for delivery a voice stream to the processor 102. The processor is configured to receive a voice stream from an audio input, such as a push-to-talk handset element 106 and encoding the voice data stream via vocoder frames such as mixed-excitation linear prediction (MELP). During vocoding, voice data is converted according to a predefined framework; the predefined framework may leave one to seven blank bits in each seven-byte packet. Existing systems insert padding to fill those one-to-seven bits.

Vocoder frames, such as MELP, that were developed for serial bit transmission have bit lengths that are not an exact number of bytes. For example, in MELP 2400, each frame comprises 54 bits of data. When these vocoder frames are transmitted by packet-based systems, such as Internet Protocol (IP), there are a few (1 to 7) bits added to pad the vocoder frame into a block of bytes Similarly, most voice encryptors, such as TSVCIS and STaCIS, have byte-sized blocks that often have unused bits in them.

In at least one embodiment, the system 100 may include one or more ancillary systems 108 (such as avionics systems in an aircraft, position location information (PLI) generated by the radio or another attached computer system, etc.) that provide a data stream to the processor 102. Based on the predefined framework, the processor 102 divides the ancillary data into a set of bits, in order, corresponding to the blank bits in encoded voice data.

In at least one embodiment, a data storage element 110 connected to the processor 102 may store the streaming ancillary data for later inclusion in the encoded voice data. The processor 102 may prioritize stored ancillary data, for example based on the originating system and/or recency, and including prioritized data into the encoded voice data during a subsequent transmission.

The processor 102 may also receive encoded voice data with ancillary data including in otherwise blank trailing bits. The processor 102 decodes the received encoded voice data according to the predefined framework. Trailing bits that would otherwise be truncated are stored, in order, to the data storage device 110. Once sufficient bits are received, the processor 102 reconstructs the message. In at least one embodiment, the message may comprise a situational awareness message according to a predefined format.

In at lease one embedment, because the ancillary data is included in portions of the encoded voice data that would otherwise be blank, a system 100 that is not otherwise adapted to extract the ancillary data will still be able to decode the encoded voice data.

In at least one embodiment, the processor 102 must periodically synchronize transmissions to accurately identify which portions of the data stream correspond to ancillary data. Transmissions may be synchronized by guaranteeing at least one "zero" in every eight bits of ancillary data. Alternatively, or in addition, the synchronization component may comprise a set of "one" bits, followed by a set of ancillary data bits, followed by a "zero" bit.

In at least one embodiment, the system 100 may comprise a node in a network, including a self-organizing network. Ancillary data may be shared via transmission of vocoded data from node-to-node. Each node receives ancillary data, assembles and stores the ancillary data in the data storage element 110 and re-encodes that ancillary data when transmitting to a different node. In at least one embodiment, the processor 102 may re-prioritize stored ancillary data, including data received from other nodes, to create a prioritization of all data for re-transmission.

In at least one embodiment, frames may be compressed according to algorithms such as byte stuffing algorithms for converting data packets to a serial transmission format, and particularly Consistent Overhead Byte Stuffing (COBS) as described in Stuart Cheshire, et al., Consistent Overhead Byte Stuffing, IEEE/ACM Transactions on Networks, Vol. 7, No. 2 (April 1999). In such case, the compressed frame or frames may be identified via a framing marker byte. When the framing marker byte is identified, the compression transformation may be reversed and ancillary data identified as described herein.

Figure 2:
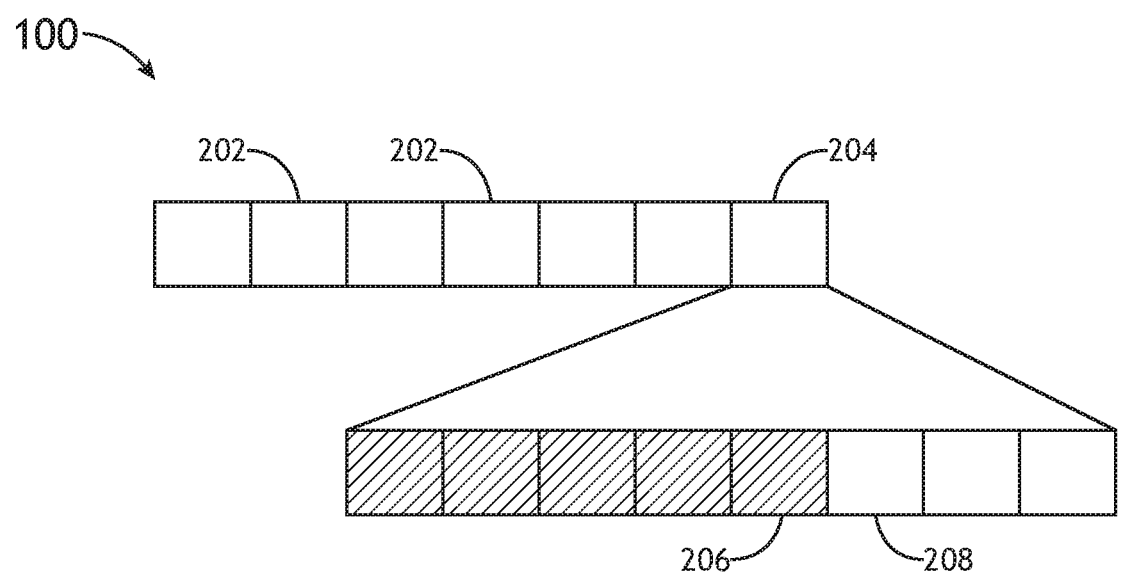
FIG. 2 shows a block diagram of an encoded voice frame.

Referring to FIG. 2, a block diagram of an encoded voice frame 200 is shown. In at least one embodiment, the voice frame 200 comprises fifty-six bits organized into seven bytes 202 for packet transmission. During vocoding, a trailing byte 204 will comprise encoded bits 206 and possibly one or more blank bits 208. The blank bits 208 do not include any vocoded data and are traditionally filled with padding.

Figure 3:
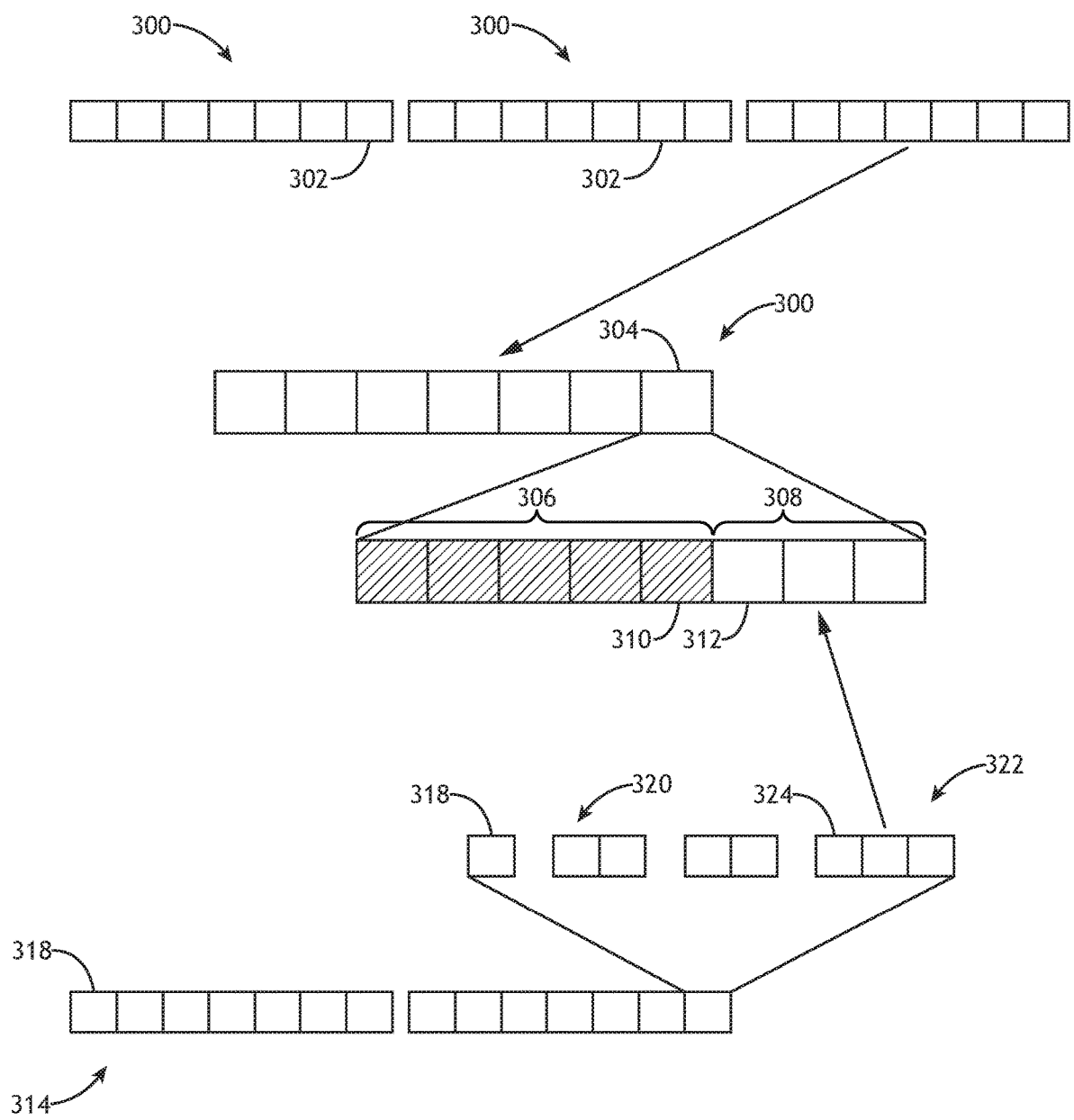
FIG. 3 shows a block representation of data incorporated into an encoded voice frame.

Referring to FIG. 3, a block representation of data incorporated into an encoded voice frame 300 is shown. An encoded voice stream comprises a plurality of vocoded frames 300, each comprising a packet of bytes 302. In at least one vocoding protocol, each frame 300 comprises fifty-six bits organized into seven bytes 302. During vocoding, a trailing byte 304 in each packet may comprise an encoded portion 306 of encoded bits 310 and a blank portion 308 of one to seven blank bits 312.

In at least one embodiment, ancillary data such as situational awareness data in a known protocol format may comprise messages 314 of twelve to twenty-four bytes 316. Situational awareness data may include latitude, longitude, altitude, entity identification, entity type, etc. During vocoding, a processor may identify the size (in bits) of blank portions 308 in each trailing byte 304. The bytes 316 in the situational awareness message 314 are divided into insertion bits 318, 320, 322 corresponding to the size of the blank portions 308. The blank portion 308 is then overwritten with a corresponding packet of insertion bits 322 of the same size with the first insertion bit 324 of the packet 322 aligned to the first bit 312 of the blank portion 308. The vocoded message with inserted ancillary data is then transmitted to a receiver. Experiments show that in some embodiments, situational awareness data messages conforming to known protocols is transmitted via vocoded data inclusion within two seconds.

Figure 4:
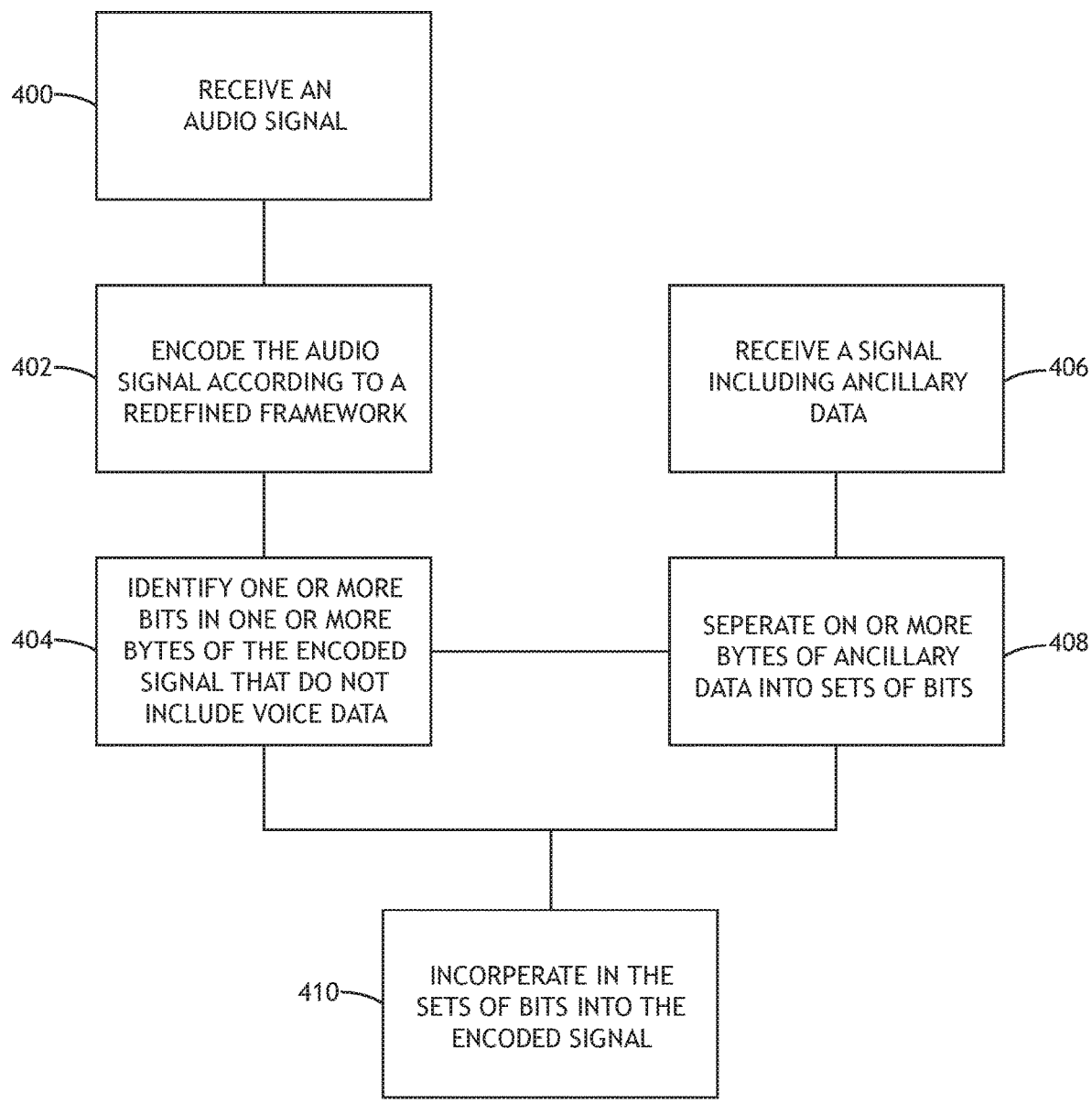
FIG. 4 shows a flowchart of a method for including ancillary data in an encoded voice data stream.

Referring to FIG. 4, a flowchart of a method for including ancillary data in an encoded voice data stream is shown. A processor receives 400 an audio signal, such as from a push-to-talk system, and encodes 402 the audio signal according to predefined vocoder framework such as MELP (MELP 600, MELP 1200, MELP 2400, etc.). The processor identifies 404 one or more blank bits in each vocoder frame.

The processor also receives 406 a signal including ancillary data such as situational awareness data. Once the available blank bits are identified 402, the ancillary data is separated 408 into packets of one or more bits according to the identified blank bits in order. The packets are then incorporated 410 in to the identified blank bits.

Figure 5:
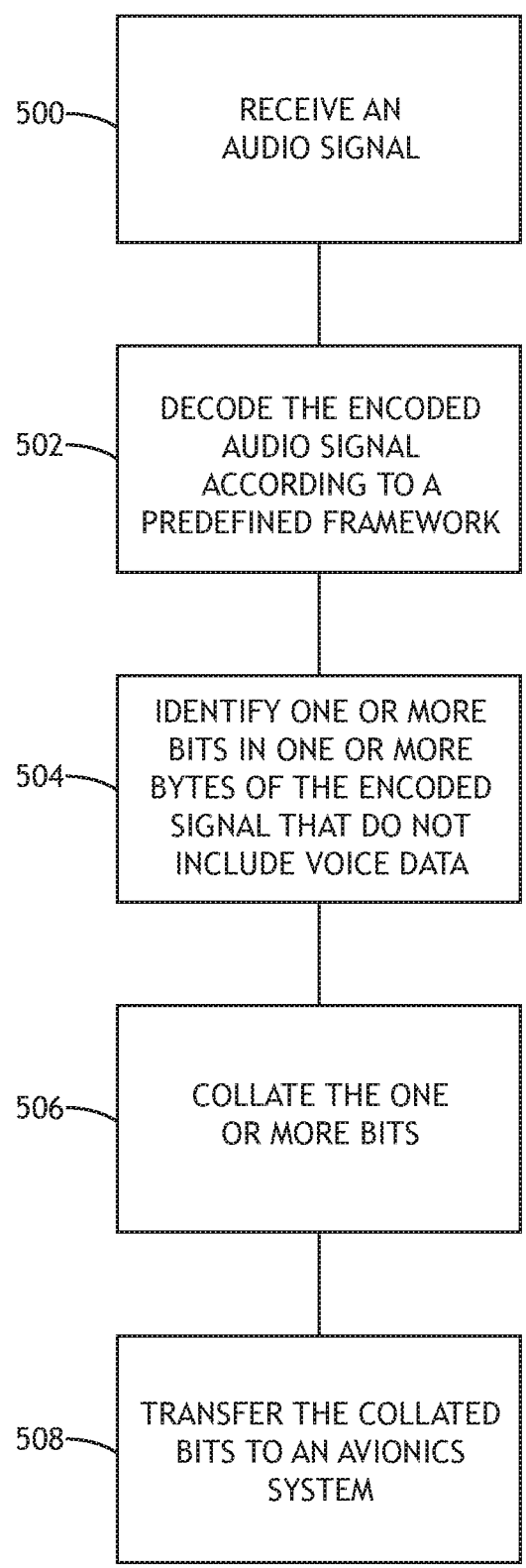
FIG. 5 shows a flowchart of a method for extracting ancillary data from an encoded voice data stream.

Referring to FIG. 5, a flowchart of a method for extracting ancillary data from an encoded voice data stream is shown. A processor receives 500 an encoded audio signal including ancillary data such as situational awareness data. The processor decodes 502 the encoded audio signal according to a framework that defines trailing bits that do not include vocoded data. The trailing bits are identified 504 and stored in the order they are received. Once all the ancillary data is received, the separate bits are collated 506 and transferred 508 to a system configured to utilize the data. In at least one embodiment, the size of the ancillary data may be defined by a protocol that dictates the number of bits in each complete message.

Systems and methods in according with the principles disclosed herein allow for transmission of ancillary data without increasing the number of bits transmitted over the air or increasing time of transmission.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A computer apparatus comprising:
a audio input device;
at least one processor in data communication with the audio input device and a memory storing processor executable code for configuring the at least one processor to:
receive a voice data stream from the audio input device;
encode the voice data stream according to a vocoder frame protocol;
identify a set of bits in a trailing byte of each frame that do not include voice data;
identify a size of each set of bits;
receive ancillary data;
insert one or more synchronization signals into the ancillary data, each of the one or more synchronization signals comprising a set of "one" bits, followed by a predetermined set of ancillary data bits, followed by one "zero" bit;
divide the ancillary data into bit packets according to the identified sizes;
replace the sets of bits with the bit packets to produce an augmented vocoded message; and
transmit the augmented vocoded message.

2. The computer apparatus of claim 1, wherein the ancillary data comprises situational awareness data from one or more of an avionics system, a radio supplying position location information, or a military command and control system.

3. The computer apparatus of claim 1, wherein the processor executable code further configures the at least one processor to prioritize the ancillary data based on at least one or a source of the ancillary data, recency of the ancillary data, or change in ancillary data as compared to a prior transmission.

4. The computer apparatus of claim 1, further comprising a data storage element, wherein:
the computer apparatus comprises a node in a self-organizing network;
receiving the ancillary data comprises receiving data from a second node in the self-organizing network; and
the processor executable code further configures the at least one processor to:
store the ancillary data; and
identify voice communication with a third node in the self-organizing network.

5. The computer apparatus of claim 4, wherein the processor executable code further configures the at least one processor to prioritize the ancillary data based on an identity of the first node and second node.

6. The computer apparatus of claim 1, wherein the processor executable code further configures the at least one processor to:
receive a vocoded signal;
identify a set of bits in a trailing byte of each frame of the vocoded signal that do not include voice data based on a vocoder framework;
extract the sets of bits;
collate the sets of bits; and
construct a situational awareness message from the collated sets of bits.

7. A computer apparatus comprising:
an antenna;
a data storage device; and
at least one processor in data communication with the antenna, the data storage device, and a memory storing processor executable code for configuring the at least one processor to:
receive a vocoded signal;
identify a set of bits in a trailing byte of each frame of the vocoded signal that do not include voice data based on a vocoder framework;
extract the sets of bits;
collate the sets of bits; and
construct and store a situational awareness message from the collated sets of bits on the data storage device.

8. The computer apparatus of claim 7, further comprising a audio input device in data communication with the at least one processor, wherein the at least one processor is further configured to:
receive a voice data stream from the audio input device;
encode the voice data stream according to a vocoder frame protocol;
identify a set of bits in a trailing byte of each frame that do not include voice data;
identify a size of each set of bits;
receive ancillary data;
divide the ancillary data into bit packets according to the identified sizes;
replace the sets of bits with the bit packets to produce an augmented vocoded message; and
transmit the augmented vocoded message.

9. The computer apparatus of claim 8, wherein the ancillary data comprises situational awareness data from one or more of an avionics system, a radio supplying position location information, or a military command and control system.

10. The computer apparatus of claim 8, wherein the processor executable code further configures the at least one processor to prioritize the ancillary data based on at least one or a source of the ancillary data and recency of the ancillary data.

11. The computer apparatus of claim 8, wherein:
the computer apparatus comprises a node in a self-organizing network;
receiving the ancillary data comprises receiving data from a second node in the self-organizing network; and
the processor executable code further configures the at least one processor to:
store the ancillary data; and
identify voice communication with a third node in the self-organizing network.

12. The computer apparatus of claim 8, wherein the processor executable code further configures the at least one processor to identify one or more synchronization signals into the ancillary data.

13. The computer apparatus of claim 12, wherein the synchronization signal comprises a set of "zero" bits, followed by a predetermined set of ancillary data bits, followed by one "one" bit.

* * * * *